United States Patent
Babcock

(10) Patent No.: US 6,423,555 B1
(45) Date of Patent: Jul. 23, 2002

(54) SYSTEM FOR DETERMINING OVERLAY ERROR

(75) Inventor: Carl P. Babcock, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 127 days.

(21) Appl. No.: 09/633,441

(22) Filed: Aug. 7, 2000

(51) Int. Cl.[7] .......................... G01R 31/26; H01L 21/66
(52) U.S. Cl. ............................ 438/14; 438/14; 438/18; 438/11; 257/48
(58) Field of Search .............................. 438/14, 11, 18, 438/401; 257/48

(56) References Cited

U.S. PATENT DOCUMENTS

| | | | | |
|---|---|---|---|---|
| 4,475,811 A | * | 10/1984 | Brunner | 355/133 |
| 4,538,105 A | * | 8/1985 | Ausschnitt | 324/158 |
| 4,992,394 A | | 2/1991 | Kostelak, Jr. et al. | 437/229 |
| 5,002,902 A | | 3/1991 | Watanabe | 437/235 |
| 5,270,255 A | | 12/1993 | Wong | 437/194 |
| 5,355,306 A | * | 10/1994 | Waldo | 364/167.01 |
| 5,403,754 A | | 4/1995 | Jackson | 437/8 |
| 5,438,413 A | | 8/1995 | Mazor et al. | 356/363 |
| 5,466,904 A | * | 11/1995 | Pfeiffer et al. | 219/121.25 |
| 5,590,456 A | * | 1/1997 | Armington et al. | 29/721 |
| 5,602,492 A | * | 2/1997 | Cresswell et al. | 324/763 |
| 5,629,772 A | | 5/1997 | Ausschnitt | 356/372 |
| 5,634,585 A | * | 6/1997 | Stansbury | 228/105 |
| 5,783,342 A | | 7/1998 | Yamashita et al. | 430/30 |
| 5,790,254 A | | 8/1998 | Ausschnitt | 356/372 |
| 5,828,224 A | * | 10/1998 | Maruyama | 324/755 |
| 5,835,195 A | * | 11/1998 | Gibson et al. | 355/53 |
| 5,835,196 A | | 11/1998 | Jackson | 355/53 |
| 5,857,258 A | * | 1/1999 | Penzes et al. | 29/846 |
| 5,920,765 A | * | 7/1999 | Naum et al. | 438/18 |
| 5,986,459 A | * | 11/1999 | Fukaya et al. | 324/755 |
| 6,072,192 A | * | 6/2000 | Fulford et al. | 257/48 |
| 6,096,567 A | * | 8/2000 | Kaplan et al. | 438/14 |
| 6,118,137 A | * | 9/2000 | Fulford et al. | 257/48 |
| 6,255,727 B1 | * | 7/2001 | Khoury | 257/693 |
| 6,277,658 B1 | * | 8/2001 | Jeng et al. | 438/14 |
| 6,278,957 B1 | * | 8/2001 | Yasuda et al. | 702/150 |
| 6,335,522 B1 | * | 1/2002 | Shimada et al. | 250/201.3 |
| 6,362,642 B1 | * | 3/2002 | Farnworth | 324/765 |

* cited by examiner

Primary Examiner—Matthew Smith
Assistant Examiner—Granvill D Lee, Jr.
(74) Attorney, Agent, or Firm—Renner, Otto, Boisselle & Sklar, LLP

(57) ABSTRACT

A method of inspecting a semiconductive wafer-in-process to determine the accuracy of alignment of a lower process layer to an upper process layer. In this method, a conductive target attribute is formed on a first alignment portion of the wafer-in-process. A contact attribute is formed on the upper process layer through which an electric path can be established with the target attribute in an acceptable alignment situation but cannot established in an unacceptable alignment situation. By attempting to establish an electric path from the target attribute through the contact attribute, the accuracy of alignment can be determined based on whether or not an electrical path is established. The target attribute may be a series of conductive strips and the contact attribute may be a series of contact holes that will overlay the corresponding target attributes in differing degrees in an acceptable alignment situation. The overlay arrangement may be such that the magnitude and/or direction of misalignment may be determined by the electrical path arrangement that is established during the inspection process.

23 Claims, 13 Drawing Sheets

SYSTEM FOR DETERMINING OVERLAY ERROR

FIELD OF THE INVENTION

This invention generally relates to semiconductor fabrication and more particularly to a system of determining overlay error while inspecting a wafer-in-process to determine the accuracy of layer-to-layer alignment and/or a method for inspecting a wafer-in-process to determine line-shortening errors in a covered layer.

BACKGROUND OF THE INVENTION

A common technique used to fabricate an integrated circuit on a semiconductor device is to build the integrated circuit in layers on a silicon wafer. Each layer corresponds to a process level during fabrication. The circuit pattern for each new layer must be placed upon the previous layer within a given spacial tolerance in order for the finished integrated circuit on the semiconductor device to perform its intended function. Alignment is the term used to describe the placement of one layer of a multiple layered integrated circuit with respect to the previous layers of the integrated circuit. As integrated circuit processing becomes more and more precise and the dimensions of the various circuit components become smaller, the necessity for precision alignment of each process layer to preceding process layers becomes greater.

Typically, a wafer will include alignment portions surrounding portions reserved for semiconductor artwork. During the semiconductor fabrication process, a target attribute will be formed on a lower layer of an alignment portion of a wafer-in-process at the same time as semiconductor features are formed on other portions of the layer. Subsequently, a contact attribute will be formed on an upper layer of the alignment portion at the same time as corresponding semiconductor features. The overlay error, or misalignment between the lower and upper layers, is then determined by optically measuring the differences between the target attributes and the contact attributes. Additionally or alternatively, it is sometimes necessary to determine line-shortening (or image-shortening) errors on a lower layer that is covered by an upper layer and optical measurements are also depended upon in this determination.

A significant problem in using optical measurements to determine the accuracy of alignment of one process layer to a subsequent process layer is that typically the target attribute is covered by a sputtered coating or an oxide or resist coating. As such, the target attribute may not be directly visible. This requires the overlay inspection to rely upon an interpretation of the overlying surface variation as an indicator of the boundaries of the covered attribute. Unfortunately, such overlay inspection technique may not be accurate due to location variations in the thickness of the covering or other asymmetries thereof.

Accordingly, a need remains for a method for accurately determining the degree of alignment of one process layer to a subsequent process layer during semiconductor processing regardless of asymmetric characteristics of coatings, coverings, or films. Additionally or alternatively there is a need for a method for accurately determining line-shortening errors in a lower process layer covered by an upper process layer.

SUMMARY OF THE INVENTION

The present invention provides a system and method for accurately measuring overlay misalignment during semiconductor process that is not affected by asymmetric characteristics of coatings or coverings. The system and method of the present invention relies on electrical measurements to determine the accuracy of alignment of one process layer to a subsequent process layer. In this manner, the errors commonly associated with optical measurements are eliminated.

The present invention provides a system and method for inspecting a semiconductive wafer-in-process to determine the accuracy of alignment of a lower process layer to an upper process layer. Conductive target attributes are formed on the lower process layer of a first alignment portion of the wafer-in-process and contact attributes are formed on and through the upper process layer through which an electrically conductive path can be established with the target attributes in an acceptable alignment situation but cannot be established in an unacceptable alignment situation. The contact attributes are selectively positioned along the upper process layer to cover respective regions over the lower process layer. The contacts are also selectively spaced apart from other contacts by predetermined distances respectively. The contacts and targets are mapped, and by determining which contacts provide conductive paths and which do not, the degree of overlay error can be determined.

In an embodiment, the forming steps comprise forming a series of target attributes and forming a corresponding series of contact attributes so that the contact attributes will overlay the corresponding target attributes in differing degrees in an acceptable alignment situation. The overlay arrangement may be such that the contact attributes will, in an acceptable alignment situation, overlay the corresponding target attributes in progressively differing degrees whereby the magnitude of misalignment may be determined in a nonacceptable alignment situation. Additionally or alternatively, the overlay arrangement may be such that contact attributes will overlay the corresponding target attributes in differing degrees in opposite directions in an acceptable alignment situation whereby the direction of misalignment may be determined in a nonacceptable alignment situation.

In an embodiment, the target attribute comprises at least one conductive strip and/or the contact attribute comprises at least one contact hole extending through the upper layer to the target attribute. The target attribute may comprise a plurality of conductive strips and the contact attribute may comprise at least one contact hole for each conductive strip through which an electric path can be established in an acceptable alignment situation but not in an unacceptable alignment situation. The contact attribute may comprise at least one row of contact holes for each conductive strip through which an electric path can be established in an acceptable alignment situation but not in an unacceptable alignment situation.

In an embodiment, the conductive target strips extend in a first direction x whereby the accuracy of alignment in the x direction may be determined based on whether or not an electrical path is established. The method may include the additional steps of forming conductive target strips that extend in ay direction transverse to the x direction on the lower layer on a second alignment portion of the wafer-in-process and forming rows of contact holes on the upper process layer through which an electric path can be established with the target strips on the second alignment portion in an acceptable alignment situation but not established in an unacceptable alignment situation. It is then attempted to establish an electric path from the target strips through the contact holes to determine the accuracy of alignment in the y direction based on whether or not an electrical path is established.

The present invention additionally or alternatively provides a method for accurately measuring line-shortening errors in a lower layer that is covered by an upper layer during semiconductor fabrication. This method also relies on electrical measurements rather than optical measurements. In this manner, measurements are not affected by asymmetric characteristics of coatings or coverings and errors commonly associated with optical measurements are eliminated.

In an embodiment, the present invention provides a method of inspecting a semiconductive wafer-in-process to determine line-shortening errors in a lower process layer covered by an upper process layer. The method comprises the steps of forming a conductive target attribute on the lower process layer on an alignment portion of the wafer-in-process and forming a contact attribute on the upper process layer through which an electric path can be established with the target attribute if line-shortening effect is within an acceptable range but not established if line-shortening effect is within an unacceptable range. By attempting to establish a conductive path from the target attribute through the contact attribute, the range of line-shortening effect can be determined based on whether or not an electrical path is established. In an embodiment, a series of target attributes and a corresponding series of contact attributes are formed in such a manner that the contact attributes will overlay the corresponding target attributes in differing degrees if the line shortening effects are within the acceptable range. For example, the contact attributes will, in an acceptable line-shortening situation, overlay the corresponding target attributes in progressively differing degrees whereby the magnitude of line-shortening may be determined in a nonacceptable line-shortening situation.

These and other features of the invention are fully described and particularly pointed out in the claims. The following description and drawings set forth in detail certain illustrative embodiments of the invention, these being indicative, however, of but a few of the various ways in which the principles of the invention may be employed.

DRAWINGS

DETAILED DESCRIPTION

Figure 1:
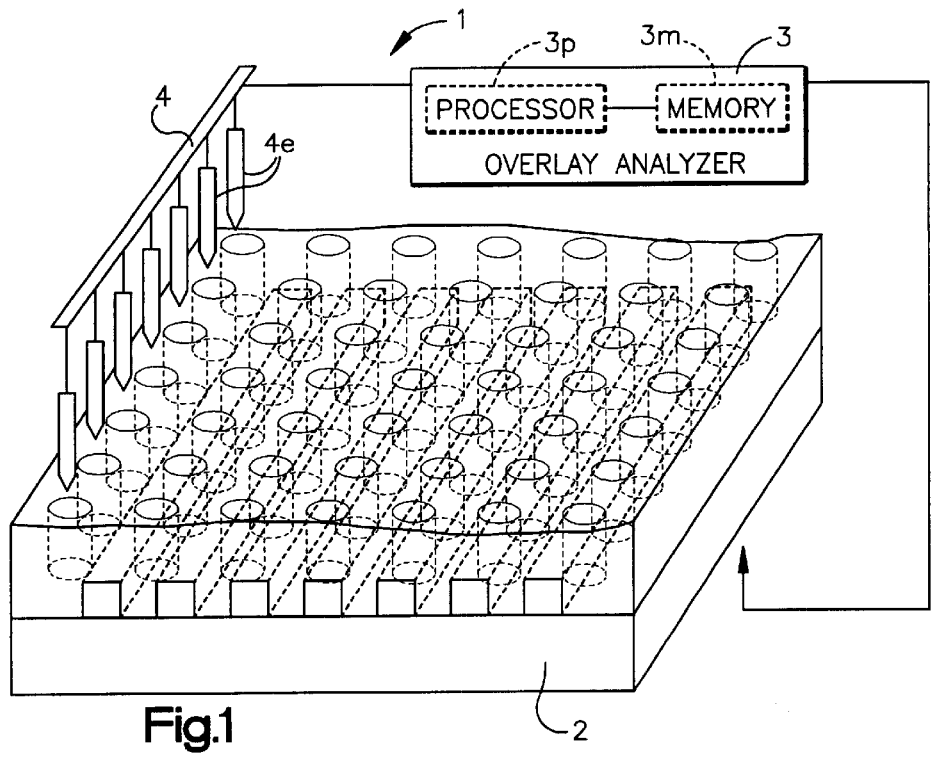
FIG. 1 is a schematic perspective view of a system according to the present invention.

Referring now to the drawings, and initially to FIG. 1, a system 1 according to the present invention is shown. The system 1 comprises a test wafer 2, an overlay analyzer 3 for determining overlay errors, and a test probe 4 which may have one or more probe elements 4e intended to make electrical connection with respective portions of the test wafer 2. The test probe 4 is operatively coupled to the overlay analyzer 3 and the overlay analyzer 3 determines overlay error using information as to whether or not an electrical connection was made between the probe 4 and conductive lines on the test wafer 2.

Figure 2:
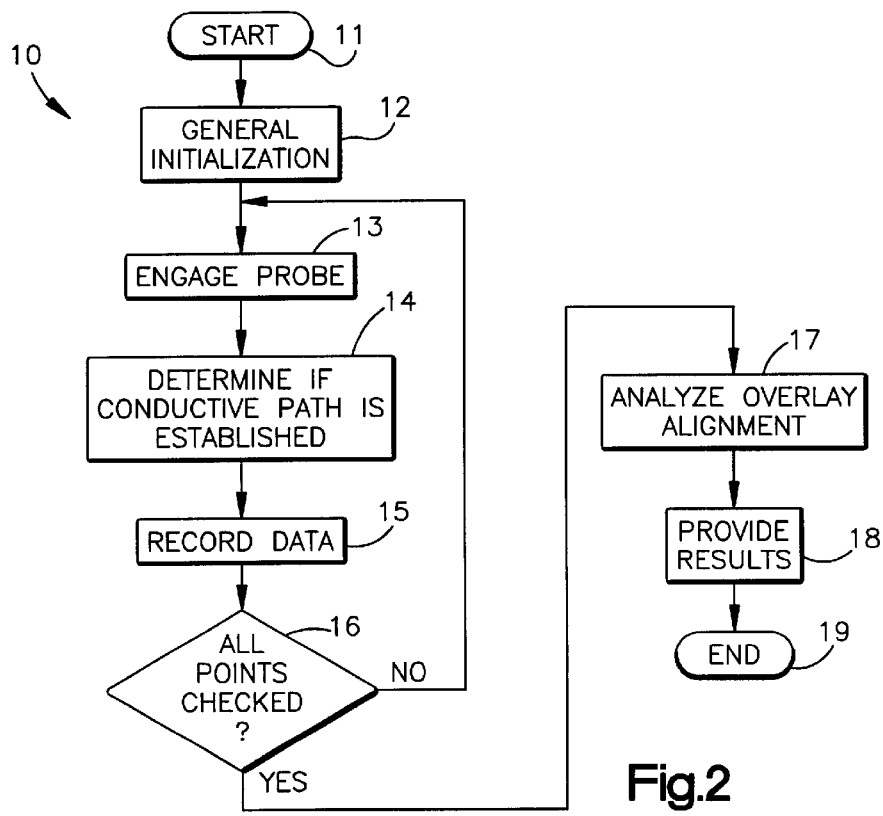
FIG. 2 is a flow chart of the method according to the present invention.

A flow chart or flow diagram of a typical processing sequence 10 for this determination is shown in FIG. 2. The sequence, for example in the form of a computer program, may be carried out in the overlay analyzer 3 (FIG. 1); the program may be stored in a memory 3m of the overlay analyzer and the steps of the program may be carried out under control and operation of a processor 3p as the overlay analyzer receives input data from the probe elements 4e of the test probe 4. The overlay analyzer 3 may be a computer, such as a PC, laptop computer, or special purpose computer, as may be desired, to carry out the various functions described herein. Programming of the overlay analyzer 3 may be carried out by a person who has ordinary skill in the art using the description herein to write the program/code in a suitable language. The overlay analyzer 3 may be used both to control positioning of the probe 4 relative to the test wafer 2, taking of data from the probe, and/or analyzing of the overlay alignment characteristics and/or line shortening characteristics (described further below, e.g., with respect to FIGS. 17–19).

The program 10 is started at step 11, e.g., the overlay analyzer 3 and/or other equipment is turned on and initial positioning or alignment of the probe 4 relative to the test wafer 2 is carried out. At step 12 general initialization of the overlay analyzer 3 is done; for example, initial values, dimensions, number of probe elements 4e, relative spacing of the probe elements, memory re-set, and/or other functions are carried out as typically would be carried out in a computerized test or measurement system. At step 13 the probe 4 is engaged whereby the probe elements 4e are directed to engage the test wafer at selected locations. At step 14 a determination is made whether respective probe elements 4e have established conductive paths with electrically conductive lines, pads, etc., of the test wafer 2. Then, the data is recorded at step 15; such data may reflect the position of respective probe elements 4e and whether or not an electrical connection has been made with the test wafer 2. An inquiry is made at step 16 to determine whether all points on the test wafer 2 have been checked by attempts to place probe elements 4e of the probe 4 into electrically conductive engagement with the respective electrically conductive portions of the test wafer 2; if all points have not yet been checked, then a loop is followed back to step 13. Further description of the efforts to place the probe 4 into engagement with the test wafer 2 is presented below.

Continuing to refer to FIG. 2, after all points have been checked, on the test wafer 2, as determined at step 16, then at step 17 overlay alignment is analyzed. The analysis takes into account the various steps described below, e.g., with respect to FIGS. 3–16 and with respect to FIGS. 17–19 with respect to which line shortening is described. The overlay analyzer 3 may process the measurement data obtained from the probe 4 to do various computations, such as those described below, to determine whether or not layers are aligned, for example, and, if not aligned, what is the extent of misalignment. Similarly, the overlay analyzer may process data obtained in detecting line shortening characteristics to determine whether there is line shortening and, if so, the extent of line shortening. Other computations and/or analyses can be made by the overlay analyzer 3, as may be desired.

At step 18 the results of the analysis made by the overlay analyzer 3 are provided. Those results may be used to control equipment, e.g., to cause loading or unloading of the test wafer 2 from the test apparatus 1, delivering the test wafer for subsequent processing and/or for repair, etc., The results also may be used as input data for subsequent processing of the test wafer, e.g., to indicate to what extent or to what degree of accuracy a next layer may be applied to the test wafer. If desired, the results may be stored and used to characterize the resulting product(s) made from the test wafer to indicate a speed rating, to indicate which parts or circuits on the test wafer are fully functional and which may not be fully functional, etc. If desired, the results of the overlay analysis may be provided on a display, on a printout, etc. Note that the overlay analysis may concern alignment of layers and/or line shortening and the results provided would reflect data, for example, from one or both of those characteristics of the test wafer 2.

Figure 3:
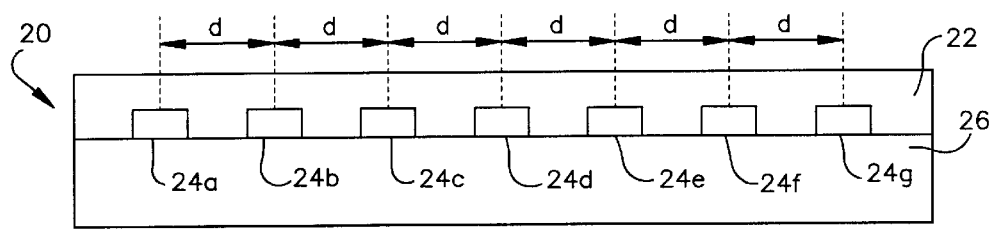
FIGS. 3 and 4 are schematic side and top views, respectively, of a lower layer of an alignment portion of a wafer-in-process.
Figure 4:
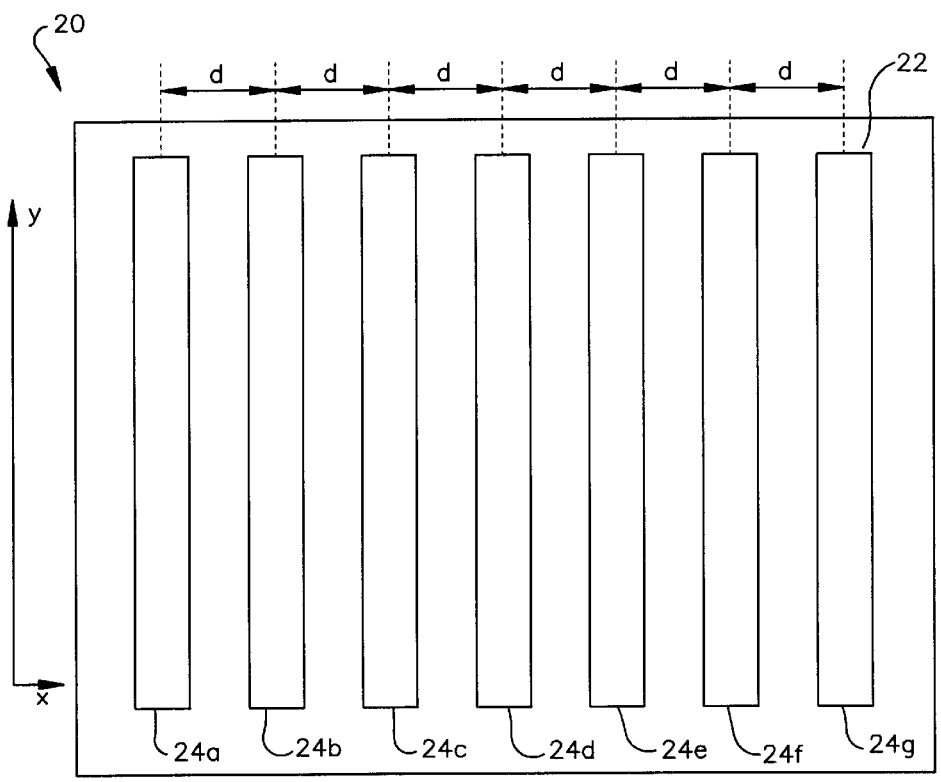

Referring now to FIGS. 3 and 4, an alignment portion 20 of a lower layer 22 of a wafer-in-process is shown. The alignment portion 20 includes a series of target strips 24a–24g (collectively referred to by reference number 24) formed during preceding lithography steps on the alignment portion of a silicon wafer 26. The remaining portions of the layer 22 (not shown) include the actual lower layer semiconductor artwork. The target strips 24 comprise a conductive material, such as a metal. In the illustrated embodiment, the target strips 24 are equally sized and extend in a first direction (y direction). The target strips 24 are equally spaced apart a distance d in a second direction that will be termed the x direction.

Figure 5:
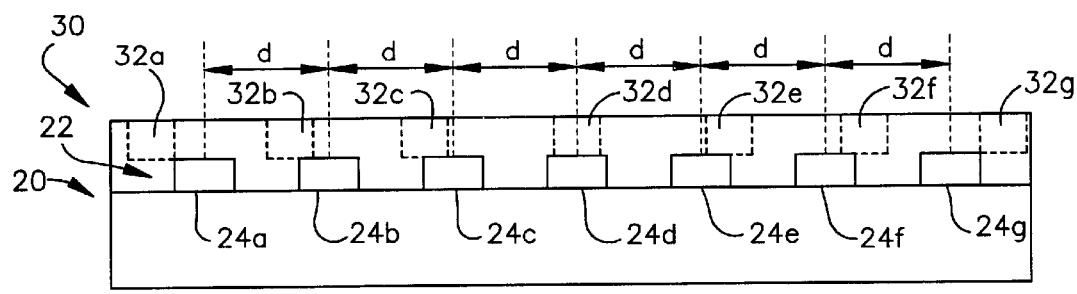
FIGS. 5 and 6 are schematic side and top views, respectively, of an upper layer of the alignment portion of the wafer-in-process, the arrangement shown being indicative of perfect alignment between the lower and upper layers in the x direction.
Figure 6:
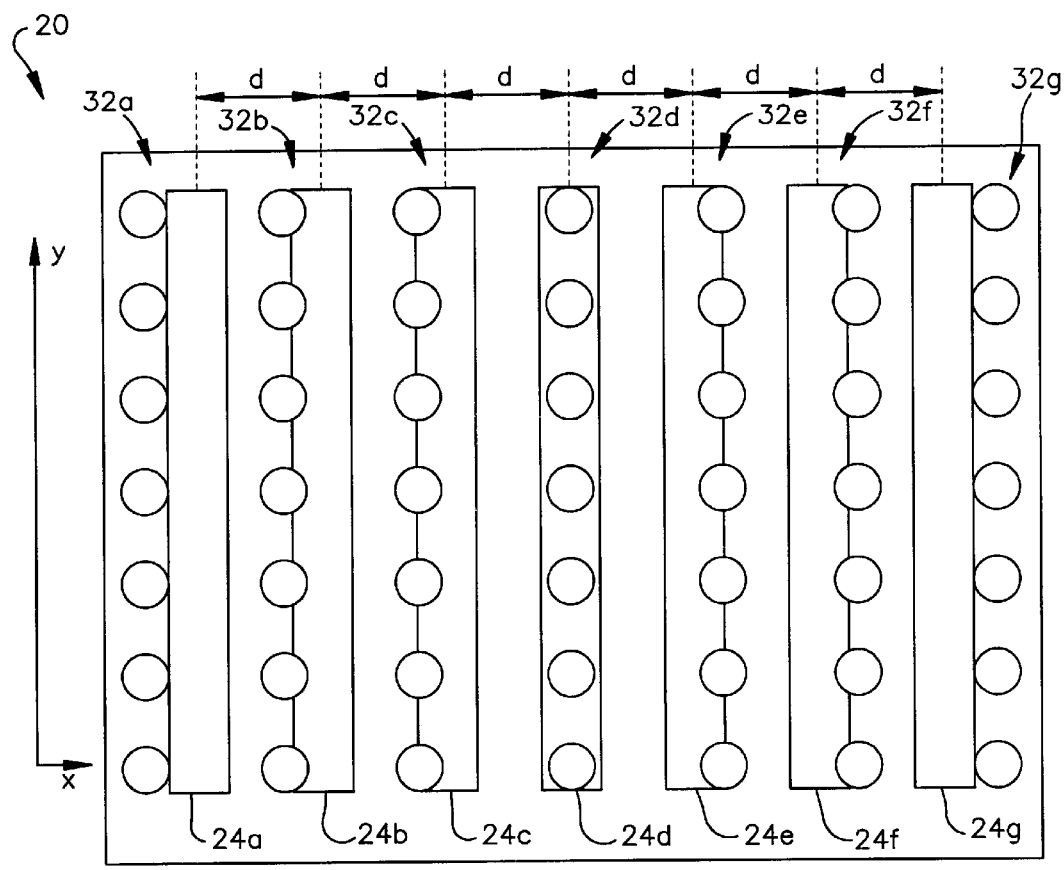
Figure 7:
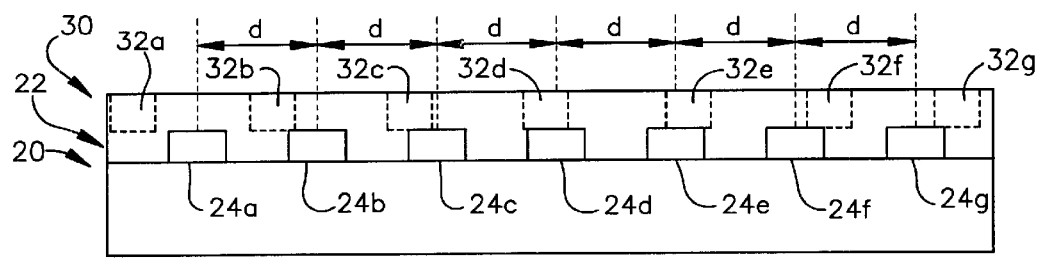
FIGS. 7 and 8 are schematic side and top views, respectively, of the upper layer of the alignment portion, the arrangement shown being indicative of an alignment shift in the negative x direction.
Figure 8:
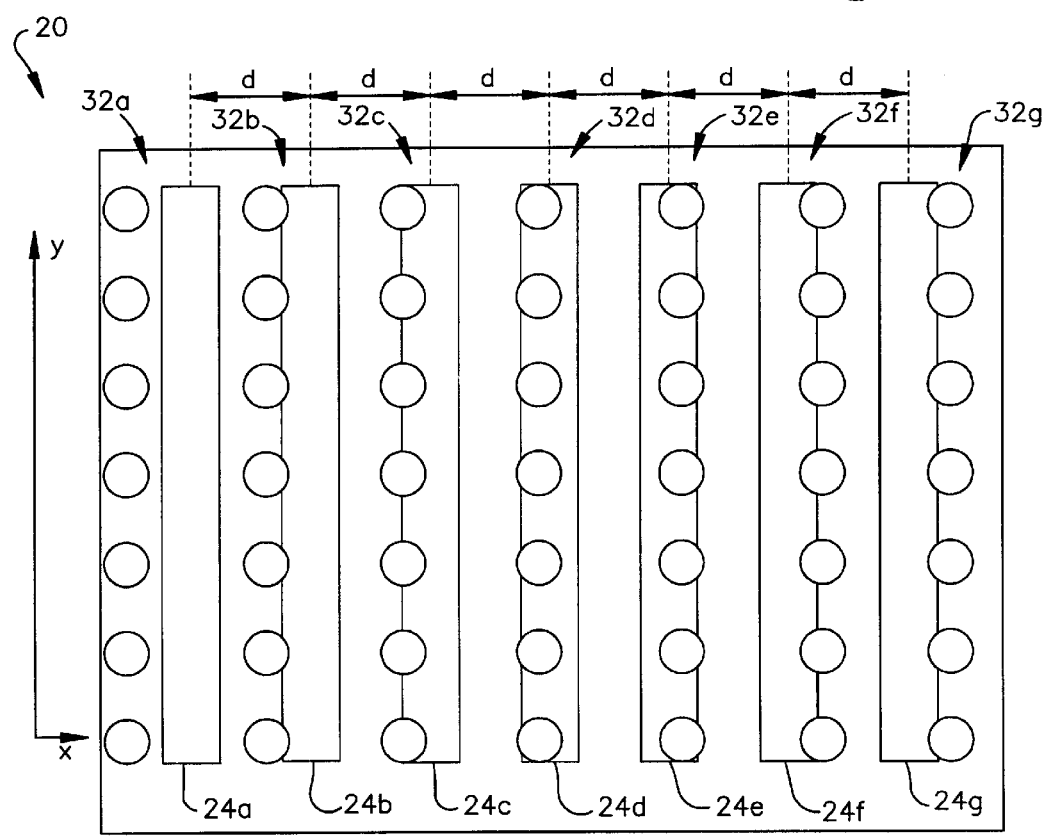

The alignment portion 20 of an upper layer 30 of the wafer-in-process formed during subsequent lithography steps is shown in FIGS. 5 and 6. The remaining portions of the layer 30 (not shown) include the actual upper layer semiconductor artwork. The alignment portion 20 of the upper layer 30 includes a series of rows of contact holes 32a–32g (collectively referred to by reference number 32).

The contact rows 32 extend in the y direction, but they are not equally spaced apart in the x direction. Instead, in the illustrated embodiment, the rows 32a–32c and 32e–32g are progressively shifted outward in the x direction from the center row 32d. Specifically, row 32c is space d+i from the center row 32d, row 32b is spaced d+2i from row 32c, and row 32a is spaced d+3i from row 32b. Likewise, row 32e is spaced d+i from the center row 32d, row 32f is spaced d+2i from the row 32e, and 32g is spaced d+3i from the row 32f.

This spacing and arrangement is chosen so that if there is substantially complete alignment between layers 22 and 30 in the x direction, the contact rows 32 will be positioned relative to the target strips 24 as shown in FIG. 6. Specifically, the center row 32d will be centrally located relative to the center target strip 24c, the rows 32a–32c will be increasingly offset from the target strips 24a–24c in the left hand direction, and the rows 32e–32g will be increasingly offset from the target strips 24e–24g in the right hand direction. It may be noted for future reference that the outermost rows 32a and 32g just barely overlay the outermost strips 24a and 24g.

The accuracy of alignment of the lower process layer 22 to the upper process layer 30 may be tested by attempting to establish a conductive chain or electrical path from the target strips 24. Specifically, a probe (shown at 4 in FIG. 1) having tips arranged in a pattern corresponding to the contact holes may be inserted through the contact holes. In an acceptable alignment situation, a conductive chain or path will be established through each and every contact hole.

Figure 9:
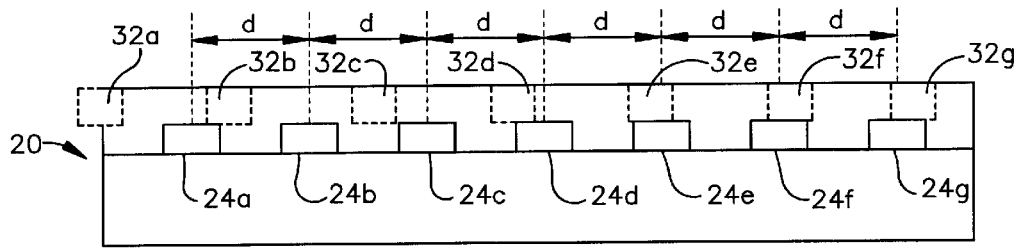
FIGS. 9 and 10 are schematic side and top views, respectively, of the upper layer of the alignment portion, the arrangement shown being indicative of a more severe alignment shift in the negative x direction compared to that illustrated in FIGS. 7 and 8.
Figure 10:
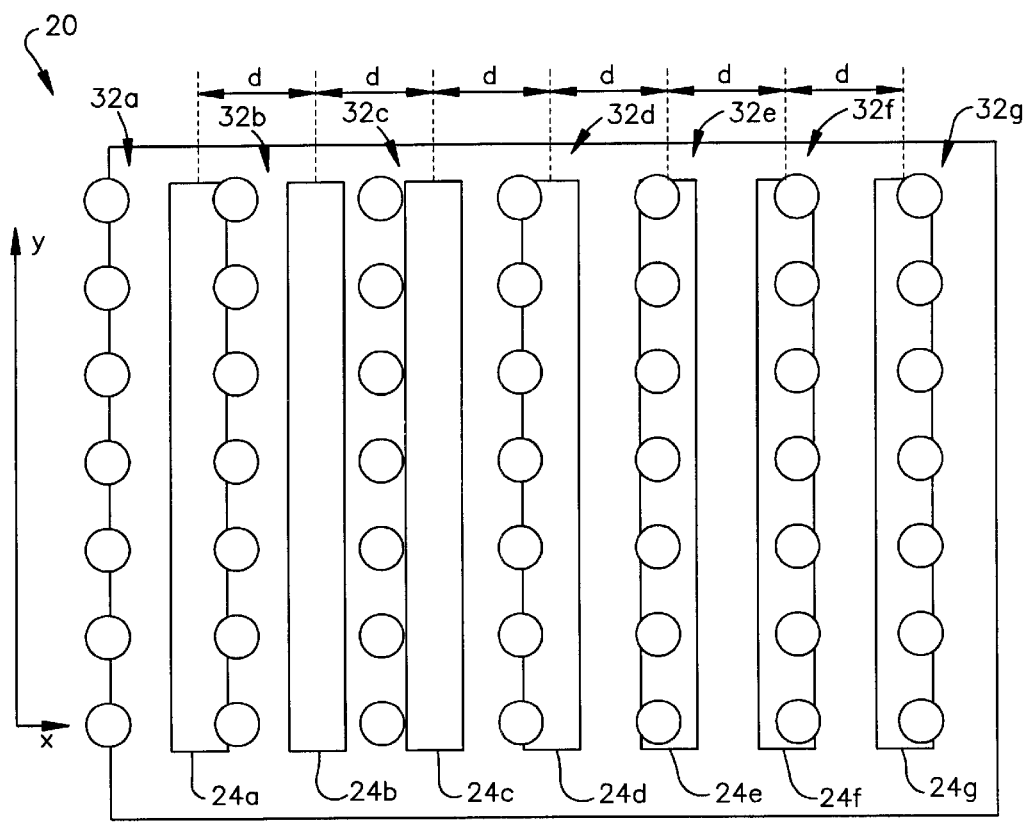
Figure 11:
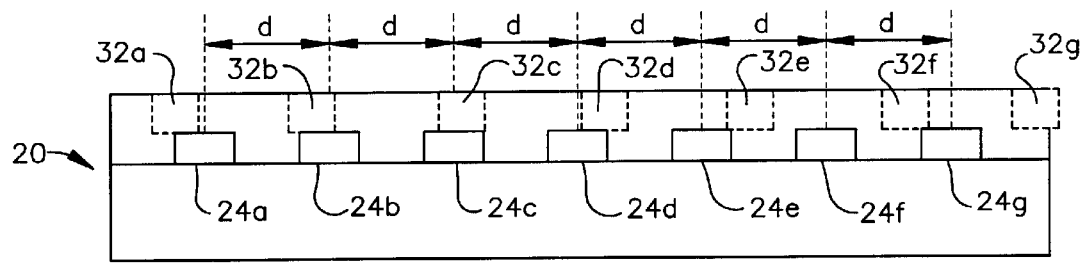
FIGS. 11 and 12 are schematic side and top views, respectively, of the upper layer of the alignment portion, the arrangement shown being indicative of an alignment shift in the positive x direction.
Figure 12:
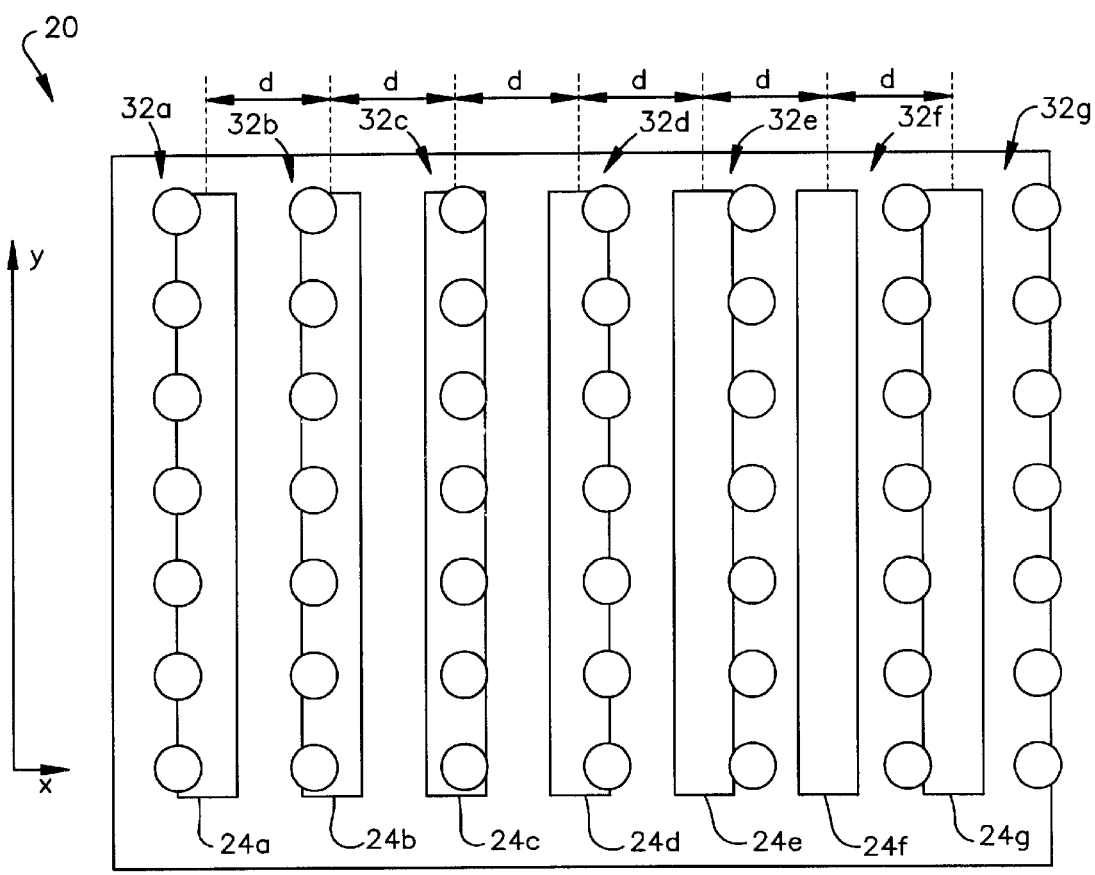

If there is unacceptable alignment in the x direction, such as is shown in FIGS. 7–12, a conductive chain will not be established for all of the contact holes. For example, as is shown FIGS. 7 and 8, a misalignment in the negative x direction results in a conductive chain not being established through the contact holes in the row 32a. As is shown in FIGS. 9 and 10, a more severe misalignment in the negative x direction results in a conductive chain not being established through the contact holes in both rows 32a and 32b. As is shown in FIGS. 11 and 12, a misalignment in the positive x direction results in a conductive chain not being established through the contact holes in the row 32g. If a conductive chain cannot be established for each of the contact holes in each of the rows 32, this means that the upper layer 30 is misaligned relative to the lower layer 22 and thus the semiconductor artwork on the remaining non-alignment portions is correspondingly misaligned.

In addition to simply signaling an unacceptable alignment situation, the direction of misalignment can be determined. Specifically, the pattern of non-conductivity reveals that there is misalignment in the negative x direction in the situations shown in FIGS. 7–10 and that there is misalignment in the positive x direction in the situation shown in FIGS. 11 and 12.

Also, the magnitude of the misalignment can be determined by the pattern of non-conductivity. For example, magnitude of misalignment is between 1i and 2i in the misalignment situations shown in FIGS. 7, 8, 10 and 12 and the magnitude of misalignment is between 2i and 3i in the severe misalignment situation shown in FIGS. 9 and 10. In this regard, it is noted that the sizing and/or spacing of the target and contact attributes should correspond to acceptable tolerance values for the desired semiconductor fabrication. More specifically, the incremental value i should be equal to or less than the acceptable alignment tolerance for the semiconductor artwork.

Figure 13:
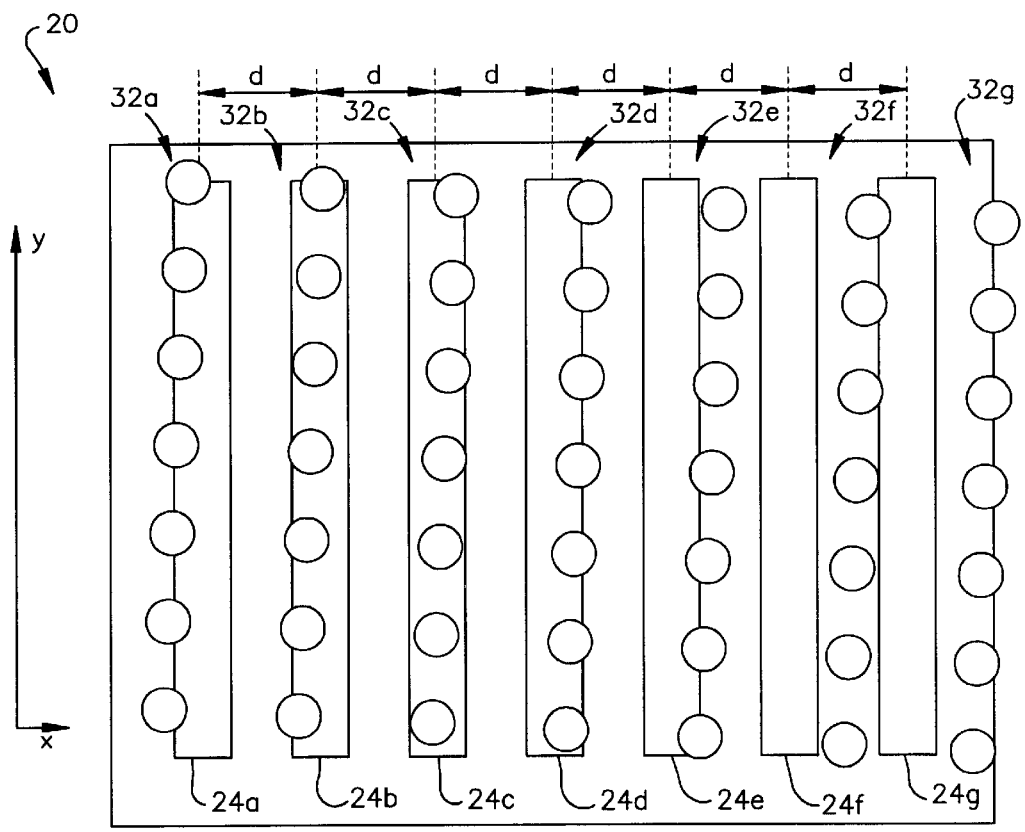
FIG. 13 is a schematic top view of the upper layer of the alignment portions, the arrangement shown being indicative of an angular alignment shift.

Furthermore, angular misalignment may be determined if, for example, some contacts of a particular row conduct and some do not, as is shown in FIG. 13.

Figure 14:
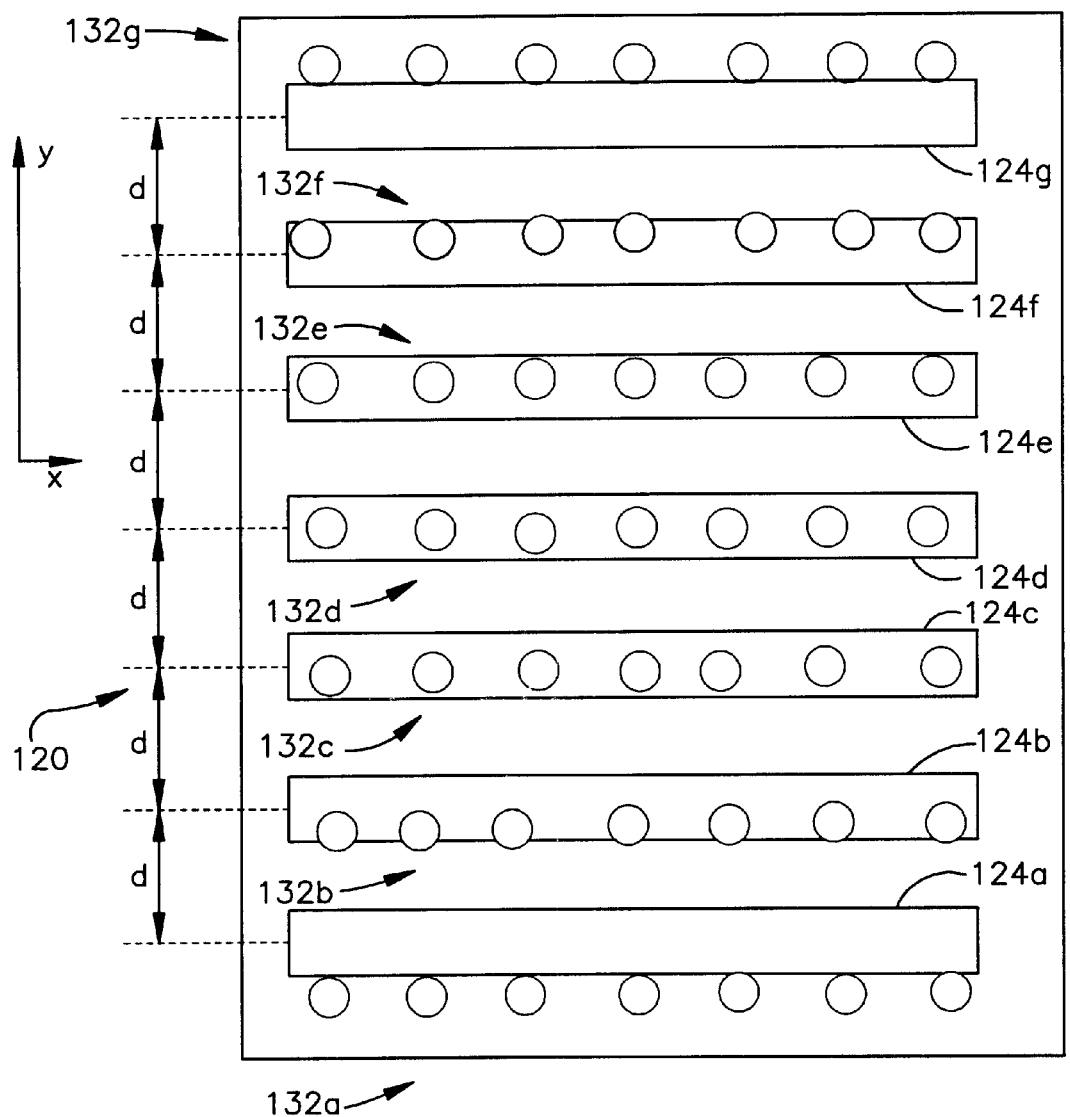
FIG. 14 is a schematic top view of the upper layer of another alignment portion of the wafer-in-process, the arrangement shown being indicative of perfect alignment between the lower and upper layers in they direction.

Referring now to FIG. 14, another alignment portion 120 of the wafer-in-process is shown. The lower layer of the alignment portion 120 (the lower and upper layers 22 and 30 are depicted in FIGS. 3 and 5, for example) includes a series of target strips 124a–124g (collectively referred to by reference number 124) formed during the same lithography steps as the strips 24a–24g and also comprise a conductive material such as a metal. In the illustrated embodiment, the target strips 124 are of equal size and extend in the y direction and are equally spaced apart a distance d in the x direction. The upper layer of the alignment portion 120 includes a series of rows of contact holes 132a–132g (collectively referred to by reference number 132). The contact rows 132 extend in the x direction and are progressively shifted outward in the y direction from the center row 132d.

Figure 15:
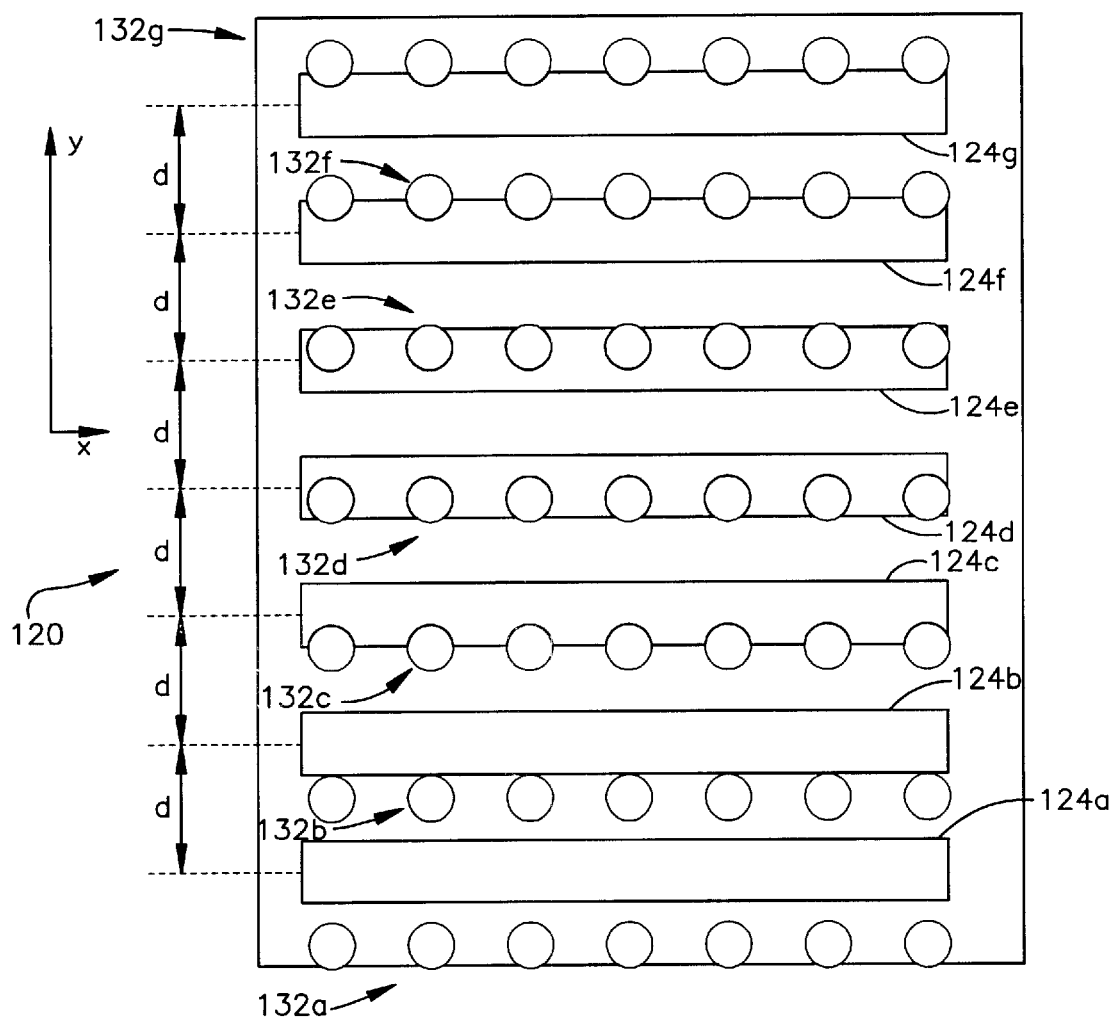
FIG. 15 is a schematic top view of the upper layer of the alignment portion shown in FIG. 11, the arrangement shown being indicative of an alignment shift in the negative y direction.
Figure 16:
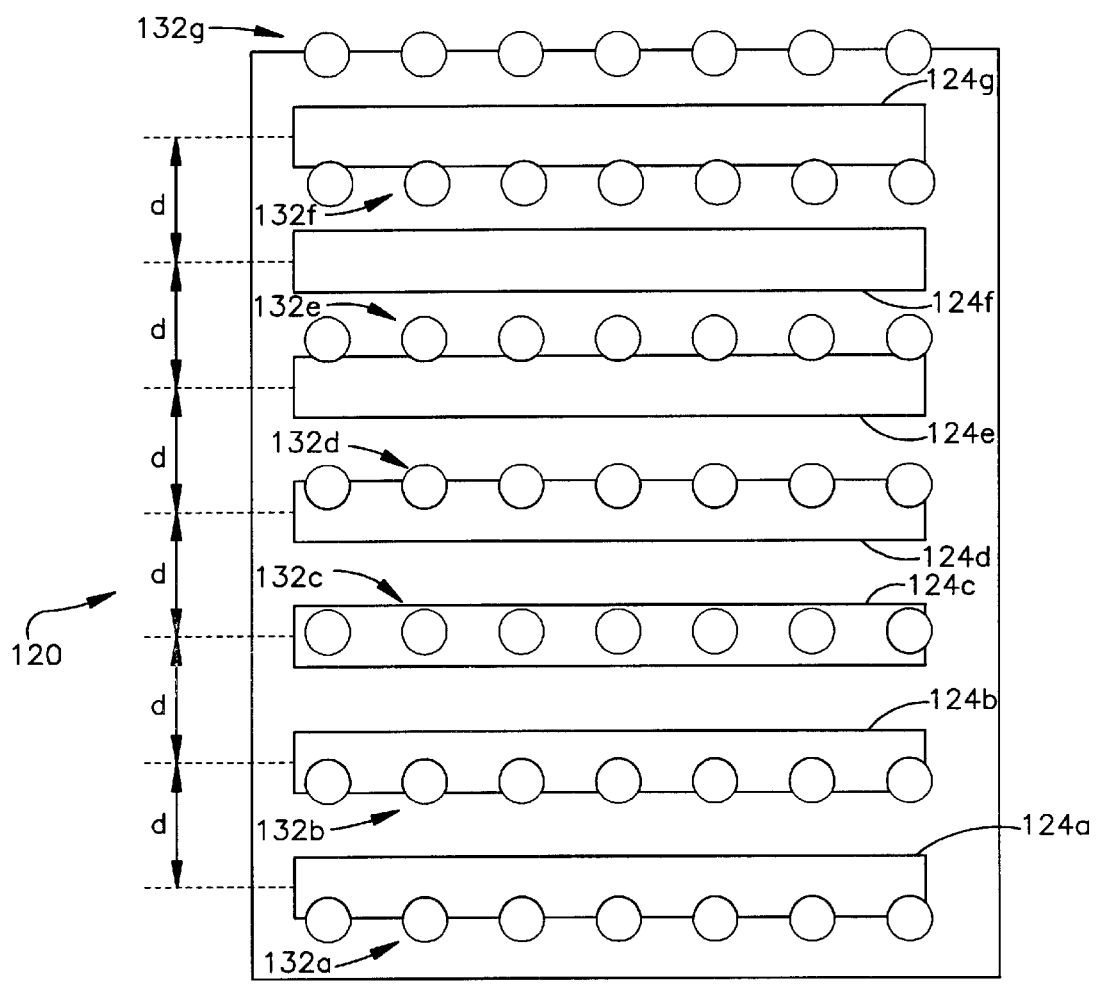
FIG. 16 is a schematic top view of the upper layer of the alignment portion shown in FIG. 11, the arrangement shown being indicative of an alignment shift in the positive y direction.

If there is acceptable alignment between layers 22 and 30 in they direction, as is shown in FIG. 14, the contact rows 132 will be positioned relative to the target strips 124 and testing with a suitable probe (not shown) will result in a conductive chain or electrical path being established for all of the contact holes. However, if there is unacceptable alignment in they direction, such as is shown in FIGS. 15 and 16, a conductive path will not be established for all of the contact holes. For example, as is shown FIG. 15, a misalignment in the negative y direction results in a conductive path not being established through the contact holes in the row 132a and, as is shown in FIG. 16, a misalignment in the positive y direction results in a conductive path not being established through the contact holes in the row 132g. The direction and the magnitude of this misalignment can also be established from the pattern of non-conductivity.

Accordingly, the present invention provides a method for accurately measuring overlay misalignment during semiconductor process that is not substantially effected by asymmetric characteristics of coatings or coverings. Particularly, the invention relies on electrical measurements, rather than optical measurements, to determine the accuracy of alignment of one process layer to a subsequent process layer. In this manner, the errors commonly associated with optical measurements are mitigated.

In the above description, the invention has only been described in connection with lower and upper layers. However, the principles of the invention can be applied to subsequent layers as well. For example, each layer could include, in different alignment portions, contact holes for correspondence with the target strips of the previous layer and target strips for correspondence with the contact holes of a subsequent layer. In this manner, registration between adjacent layers of a wafer-in-process could be verified and/or measured.

Figure 17:
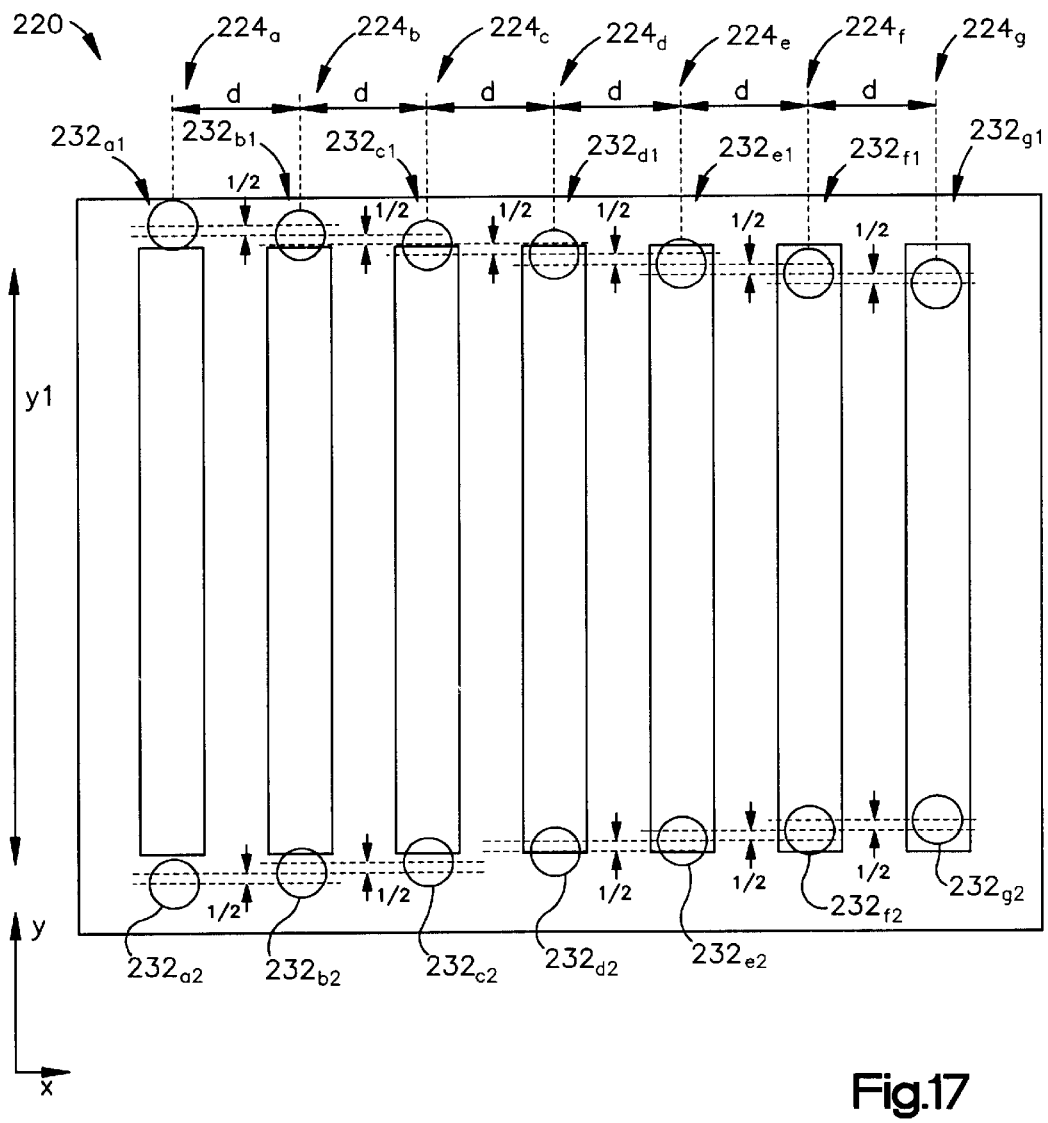
FIG. 17 is a schematic top view of the upper layer of another alignment portion of the wafer-in-process, the arrangement shown being indicative of no line shortening effects.

The present invention also provides a method for determining line shortening errors. Specifically, as shown in FIG. 17, another alignment portion 220 of the wafer-in-process may be provided. The lower layer 22 of the alignment portion 220 includes a series of conductive (e.g., metal) target strips 224a–224g (collectively referred to by reference number 224) formed by a lithography process. In the illustrated embodiment, the target strips 224 are intended to be formed of equal lengths $y_1$ in the y direction and are equally spaced apart distance d in the x direction. However, due to possible focusing problems in the system under test, the lines may have been formed shorter than desired. The present invention provides for determining the existence of mis-formed lines and the degree of focusing problems.

The upper layer of the alignment portion 220 includes pairs of contact holes $232a_1$–$232g_2$ (collectively referred to by reference number 232). The pairs of contact holes 232 are aligned in the x direction, but they are not equally spaced apart in the y direction. Instead, in the illustrated embodiment, each pair of holes 232a–232g respectively, are spaced apart differently from the other pairs. Specifically, if the first pair of contact holes 232a are spaced apart a distance d, the second pair of contact holes 232b are spaced apart a distance d–i, the third pair of contact holes 232c are spaced apart a distance d–2i, the fourth pair of contact holes 232d are spaced apart a distance of d–3i, the fifth pair of contact holes 232e are spaced apart a distance of d–4i, the sixth pair of contact holes 232f are spaced apart a distance of d–5i, and the seventh pair of contact holes 232g are spaced apart a distance of d–6i.

This spacing and arrangement is chosen so that if there is no line-shortening effect, the first pair of contact holes 232a will just barely contact the ends of the target strips 222a as is shown in FIG. 17. In this manner, possible line-shortening may be determined by attempting to establish a conductive path from the target strips 224. Specifically, a probe (not shown) having tips arranged in a pattern corresponding to the contact holes may be inserted through the contact holes.

Figure 18:
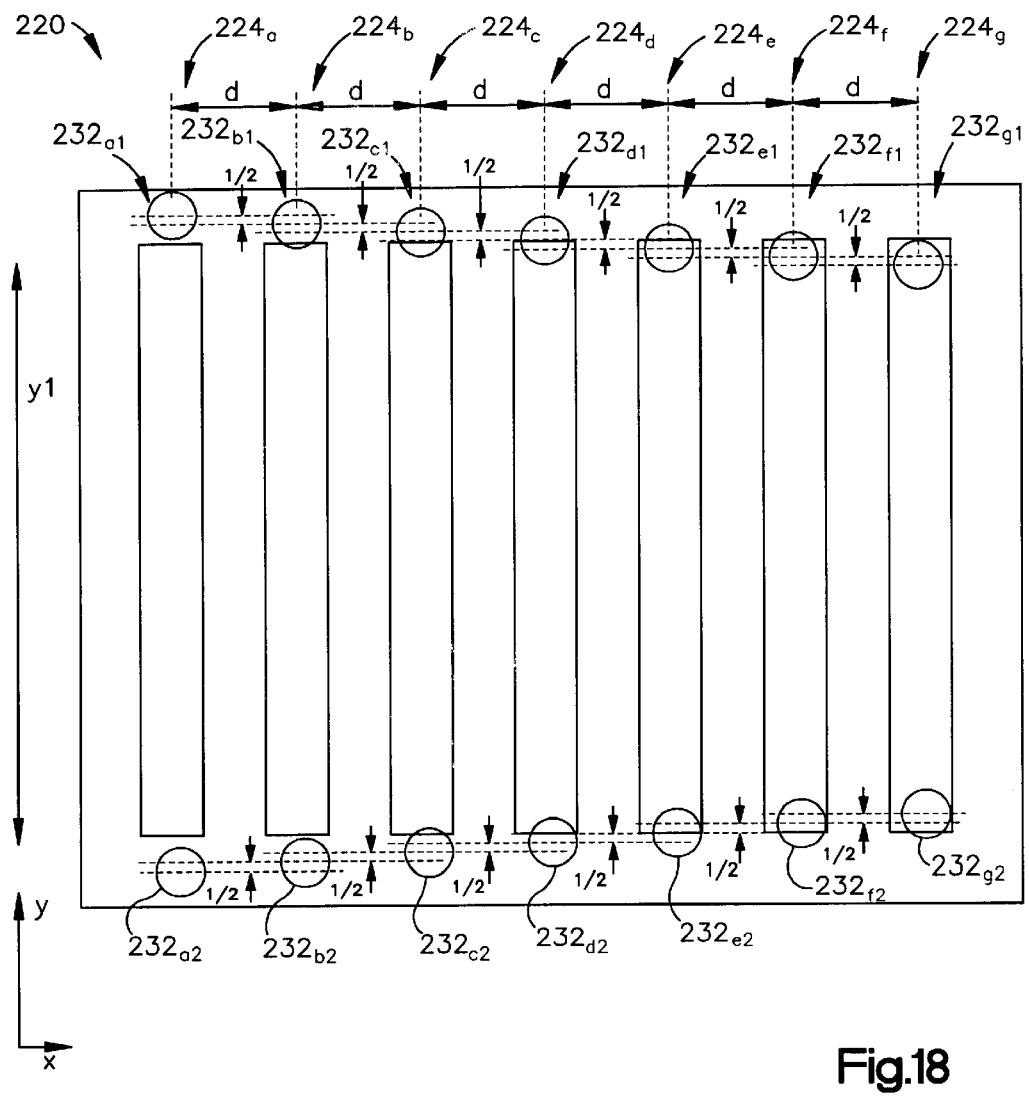
FIG. 18 is a schematic top view of the upper layer of the alignment portion shown in FIG. 17, the arrangement shown being indicative of line shortening effects.
Figure 19:
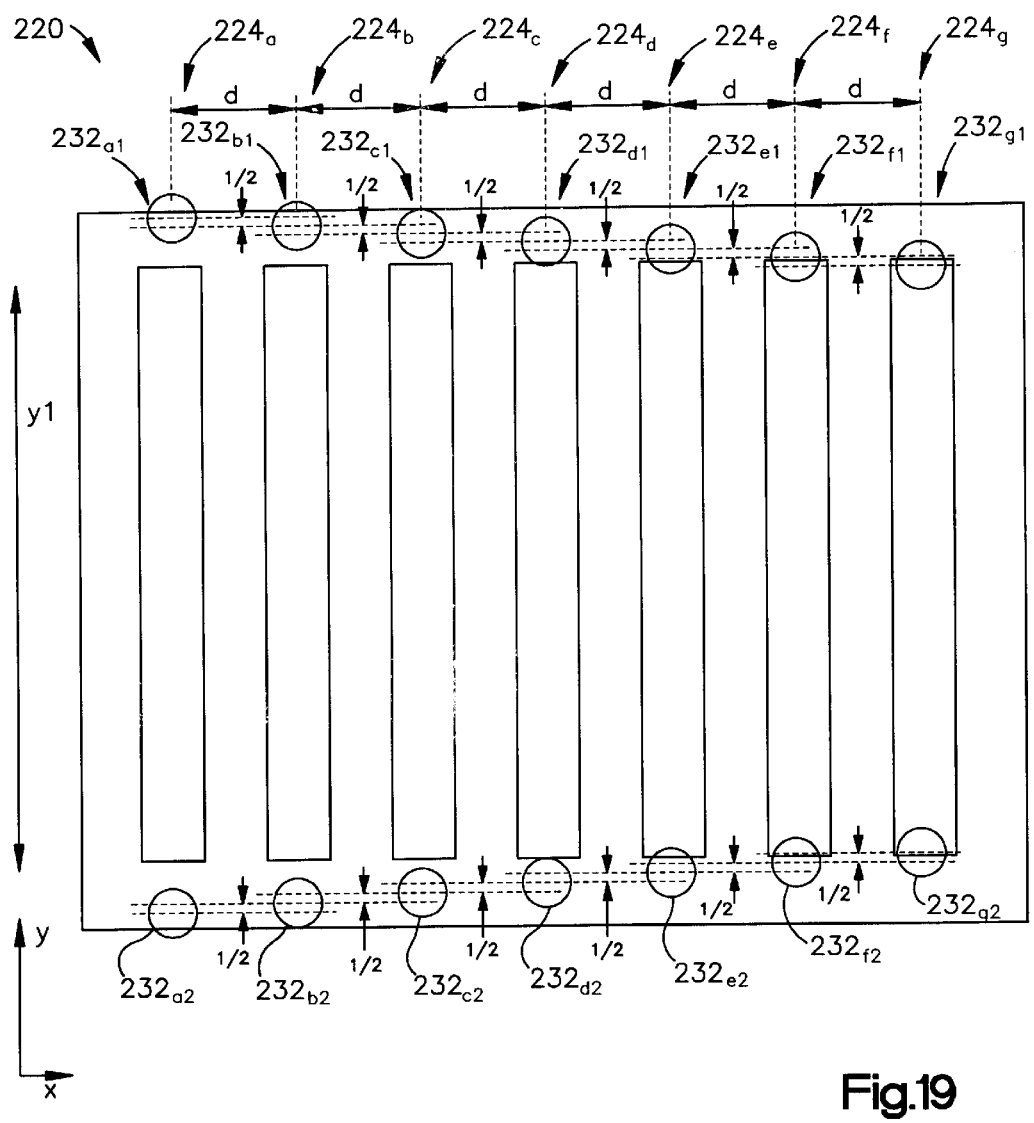
FIG. 19 is a schematic top view of the upper layer of the alignment portion shown in FIG. 17, the arrangement shown being indicative of more sever line shortening effects compared to the illustration in FIG. 18.

If there has been no line-shortening as shown in FIG. 17, a conductive path will be established through each and every contact hole 232. However, if there has been line shortening, such as is shown in FIGS. 18 and 19, a conductive path will not be established for all of the contact holes. For example, as is shown FIG. 18, line shortening results in a conductive path not being established for the pair of contact holes 232a and, as is shown in FIG. 19, more severe line shortening results in a conductive path not being established for contact holes 232a and contact holes 232b. Detecting the existence or not of such conductive paths and determining the extent of line-shortening can be carried out, for example, using the analyzer 3 of FIG. 1, e.g., as was described above with respect to FIG. 2. In this manner, both the existence and the magnitude of line-shortening effects can be determined. For example, the magnitude of line shortening effects is between 1i and 2i in the situation shown in FIG. 18 and is between 2i and 3i in the situation shown in FIG. 19. Measurement, computation and display of the magnitude of line shortening can be carried out using the analyzer 3, for example. Again, the spacing of the contact attributes should correspond to acceptable tolerance values for the desired semiconductor fabrication, that is, the incremental value i should be equal to or less than the acceptable line-shortening effect tolerance for the semiconductor artwork.

Accordingly, the present invention also provides a method for accurately measuring line shortening errors in a covered process layer during semiconductor fabrication that is not effected by asymmetric characteristics of coatings or coverings.

Although the invention has been shown and described with respect to the illustrated embodiments, it is apparent that certain alterations and modifications will occur to others skilled in the art upon a reading and understanding of this specification. The present invention includes all such alterations and modifications and is limited only by the following claims.

What is claimed is:

1. A system for determining overlay error, comprising:
   a test wafer, including:
     a plurality of conductive lines;
     a layer of non-conductive material covering the conductive lines;
     a plurality of contact arrays formed in the layer, each array including a plurality of contact holes passing through the layer;
   a overlay analyzer for determining overlay error;
   a test probe operatively coupled to the overlay analyzer, the test probe operative to pass through at least one of the contact holes and establish an electrical connection with at least one of the conductive lines;
   wherein the overlay analyzer determines overlay error using information as to whether or not an electrical connection was made between the probe and the at least one conductive line.

2. A system for determining overlay error, comprising:
   a test wafer, including:
     a plurality of conductive lines;
     a layer of non-conductive material covering the conductive lines;
     a plurality of contact arrays formed in the layer, each array including a plurality of contact holes passing through the layer;
   an overlay analyzing means for determining overlay error;
   test probe means, operatively coupled to the overlay analyzer, for passing through at least one of the contact holes and establishing an electrical connection with at least one of the conductive lines;
   wherein the overlay analyzing means determines overlay error using information as to whether or not an electrical connection was made between the test probe means and the at least one conductive line.

3. A system for determining line shortening on a wafer, comprising:
   conductive lines formed on the wafer;
   a layer of non-conductive material formed over the conductive lines;
   at least first, second and third contact arrays formed in the layer, each array including at least a pair of contact holes passing through the layer, where the contact holes pair of the first array are separated by a distance greater than the distance between contact holes of the second array pair, and the distance between the holes of the second array pair is greater than the distance between contact holes of the third array pair;
   a line shortening analyzer for determining shortening of the conductive lines;
   a test probe operatively coupled to the analyzer, the test probe operative to pass through at least one of the contact holes and establish an electrical connection with at least one of the conductive lines;
   wherein the analyzer determines line shortening error using information as to whether or not an electrical connection was made between the probe and the at least one conductive line.

4. A method of inspecting a semiconductive wafer-in-process to determine the accuracy of alignment of a lower process layer to an upper process layer, said method comprising the steps of:
   forming a conductive target attribute on a first alignment portion of the wafer-in-process;
   forming a contact attribute on the upper process layer through which an electric path can be established with the target attribute in an acceptable alignment situation but cannot be established in an unacceptable alignment situation;
   attempting to establish an electric path from the target attribute through the contact attribute; and
   determining the accuracy of alignment based on whether or not an electrical path is established.

5. A method as set forth in claim 4 wherein the forming steps comprise forming a series of target attributes and forming a corresponding series of contact attributes and wherein the contact attributes will overlay the corresponding target attributes in differing degrees in an acceptable alignment situation.

6. A method as set forth in claim 5 wherein the contact attributes will, in an acceptable alignment situation, overlay the corresponding target attributes in progressively differing degrees whereby the magnitude of misalignment may be determined in a nonacceptable alignment situation.

7. A method as set forth in claim 6 wherein the contact attributes will overlay the corresponding target attributes in differing degrees in opposite directions in an acceptable alignment situation whereby the direction of misalignment may be determined in a nonacceptable alignment situation.

8. A method as set forth in claim 5 wherein the contact attributes will overlay the corresponding target attributes in differing degrees in opposite directions in an acceptable alignment situation whereby the direction of misalignment may be determined in a nonacceptable alignment situation.

9. A method as set forth in claim 4 wherein the contact attribute comprises at least one contact hole extending through the upper layer to the target attribute.

10. A method as set forth in claim 4 wherein the target attribute comprises at least one conductive strip.

11. A method as set forth in claim 10 wherein the target attribute comprises a plurality of conductive strips.

12. A method as set forth in claim 11 wherein the contact attribute comprises at least one contact hole for each conductive strip through which an electric path can be established in an acceptable alignment situation but not in an unacceptable alignment situation.

13. A method as set forth in claim 12 wherein the contact attribute comprises at least one row of contact holes for each conductive strip through which an electric path can be established in an acceptable alignment situation but not in an unacceptable alignment situation.

14. A method as set forth in claim 13 wherein the contact holes, in an acceptable alignment situation, overlay the corresponding target strips in progressively differing degrees whereby the magnitude of misalignment may be determined in a nonacceptable alignment situation.

15. A method as set forth in claim 14 wherein the contact holes will overlay the corresponding conductive target strips in differing degrees in opposite directions in an acceptable alignment situation whereby the direction of misalignment may be determined in a nonacceptable alignment situation.

16. A method as set forth in claim 15 wherein the strips extend in a first direction y and wherein said attempting and said determining steps determine the accuracy of alignment in a direction x transverse to the y direction based on whether or not an electrical path is established.

17. A method as set forth in claim 16 further comprising the steps of:
   forming conductive target strips that extend in the x direction on a second alignment portion of the wafer-in-process;

forming rows of contact holes on the upper process layer through which an electric path can be established with the target strips on the second alignment portion in an acceptable alignment situation but not established in an unacceptable alignment situation;

attempting to establish an electric path from the target strips through the contact holes; and determining the accuracy of alignment in the y direction based on whether or not an electrical path is established.

18. A method as set forth in claim 17 further comprising the steps of:

forming a conductive target attribute on a third alignment portion of the wafer-in-process;

forming a contact attribute on the upper process layer through which an electric path can be established with the target attribute if line-shortening effect is within an acceptable range but not established if line-shortening effect is within an unacceptable range;

attempting to establish an electric path from the target attribute through the contact attribute; and determining the existence of line-shortening effect based on whether or not an electrical path is established.

19. A method as set forth in claim 18 wherein the forming steps comprise forming a series of target attributes and forming a corresponding series of contact attributes and wherein the contact attributes will overlay the corresponding target attributes in differing degrees if the line shortening effects are within the acceptable range.

20. A method as set forth in claim 19 wherein the contact attributes will, in an acceptable line-shortening situation, overlay the corresponding target attributes in progressively differing degrees whereby the magnitude of line-shortening may be determined in a nonacceptable line-shortening situation.

21. A method of inspecting a semiconductive wafer-in-process to determine line-shortening errors of a lower process layer covered by an upper process layer, said method comprising the steps of:

forming a conductive target attribute on an alignment portion of the wafer-in-process;

forming a contact attribute on the upper process layer through which an electric path can be established with the target attribute if line-shortening effect is within an acceptable range but not established if line-shortening effect is within an unacceptable range;

attempting to establish an electric path from the target attribute through the contact attribute; and determining the range of line-shortening effect based on whether or not an electrical path is established.

22. A method as set forth in claim 21 wherein the forming steps comprise forming a series of target attributes and forming a corresponding series of contact attributes and wherein the contact attributes will overlay the corresponding target attributes in differing degrees if the line shortening effects are within the acceptable range.

23. A method as set forth in claim 22 wherein the contact attributes will, in an acceptable line-shortening situation, overlay the corresponding target attributes in progressively differing degrees whereby the magnitude of line-shortening may be determined in a nonacceptable line-shortening situation.

* * * * *

UNITED STATES PATENT AND TRADEMARK OFFICE
CERTIFICATE OF CORRECTION

PATENT NO. : 6,423,555 B1
DATED : July 23, 2002
INVENTOR(S) : Babcock

It is certified that error appears in the above-identified patent and that said Letters Patent is hereby corrected as shown below:

Column 4,
Line 7, replace "they direction" with -- the y direction --

Signed and Sealed this

Eighteenth Day of February, 2003

JAMES E. ROGAN
*Director of the United States Patent and Trademark Office*